(12) United States Patent
Cai

(10) Patent No.: US 9,406,515 B2
(45) Date of Patent: Aug. 2, 2016

(54) LASER ANNEALING DEVICE INCLUDING TUNABLE MASK AND METHOD OF USING THE SAME

(71) Applicant: SEMICONDUCTOR MANUFACTURING INTERNATIONAL (SHANGHAI) CORPORATION, Shanghai (CN)

(72) Inventor: BoXiu Cai, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 14/944,047

(22) Filed: Nov. 17, 2015

(65) Prior Publication Data

US 2016/0079065 A1 Mar. 17, 2016

Related U.S. Application Data

(62) Division of application No. 13/935,265, filed on Jul. 3, 2013, now Pat. No. 9,257,287.

(30) Foreign Application Priority Data

Dec. 12, 2012 (CN) .......................... 2012 1 0533375

(51) Int. Cl.
| | |
|---|---|
| *H01L 21/268* | (2006.01) |
| *H01L 21/20* | (2006.01) |
| *H01L 21/263* | (2006.01) |
| *H01L 21/26* | (2006.01) |
| *H01L 21/324* | (2006.01) |
| *B23K 26/04* | (2014.01) |
| *B23K 26/073* | (2006.01) |
| *B23K 26/08* | (2014.01) |
| *G02B 27/09* | (2006.01) |

(52) U.S. Cl.
CPC .......... *H01L 21/268* (2013.01); *H01L 21/2026* (2013.01); *H01L 21/26* (2013.01); *H01L 21/263* (2013.01); *H01L 21/2636* (2013.01); *H01L 21/324* (2013.01); *B23K 26/04* (2013.01); *B23K 26/0736* (2013.01); *B23K 26/0738* (2013.01); *B23K 26/0853* (2013.01); *G02B 27/0922* (2013.01); *G02B 27/0933* (2013.01); *G02B 27/0955* (2013.01); *G02B 27/0977* (2013.01)

(58) Field of Classification Search
CPC .. H01L 21/268; H01L 21/324; H01L 21/2636
See application file for complete search history.

(56) References Cited

U.S. PATENT DOCUMENTS

| | | |
|---|---|---|
| 5,686,979 A | 11/1997 | Weber et al. |
| 6,528,217 B2 | 3/2003 | Cutter et al. |
| 6,542,682 B2 | 4/2003 | Cotteverte et al. |

(Continued)

FOREIGN PATENT DOCUMENTS

| | | |
|---|---|---|
| CN | 1414616 | 4/2003 |
| CN | 101217109 | 7/2008 |

*Primary Examiner* — John P Dulka
(74) *Attorney, Agent, or Firm* — Innovation Counsel LLP

(57) ABSTRACT

A laser annealing device for compensating wafer heat maps and its method are disclosed. A laser annealing device comprises a pump laser source array including of a plurality of pump laser sources for irradiating a tunable mask, each pump laser source emitting pump laser, an annealing laser source for emitting annealing laser and irradiating the tunable mask, and a tunable mask for transmitting at least part of the annealing laser after being irradiated by the pump laser.

8 Claims, 6 Drawing Sheets

(56) References Cited

U.S. PATENT DOCUMENTS

| | | |
|---|---|---|
| 6,888,616 B2 | 5/2005 | Cooper et al. |
| 7,078,323 B2 | 7/2006 | Hartzell |
| 7,192,479 B2 | 3/2007 | Mitani et al. |
| 7,482,254 B2 | 1/2009 | Bakeman |
| 7,595,208 B2 * | 9/2009 | Jennings ............ B23K 26/0066 257/E21.134 |
| 7,804,042 B2 | 9/2010 | Li et al. |
| 2002/0036299 A1 | 3/2002 | Young et al. |
| 2003/0196996 A1 | 10/2003 | Jennings et al. |
| 2003/0202728 A1 | 10/2003 | Leonard et al. |
| 2004/0018008 A1 | 1/2004 | Koren et al. |
| 2004/0027645 A1 | 2/2004 | Ishihara |
| 2005/0098552 A1 | 5/2005 | Timans |
| 2005/0214986 A1 | 9/2005 | Tanaka et al. |
| 2006/0138351 A1 | 6/2006 | Jyumonji et al. |
| 2007/0293058 A1 | 12/2007 | Jennings et al. |
| 2009/0212769 A1 | 8/2009 | Stoica et al. |
| 2010/0085585 A1 * | 4/2010 | Stowe ...................... B41J 2/475 358/1.7 |
| 2010/0099268 A1 | 4/2010 | Timans |

* cited by examiner

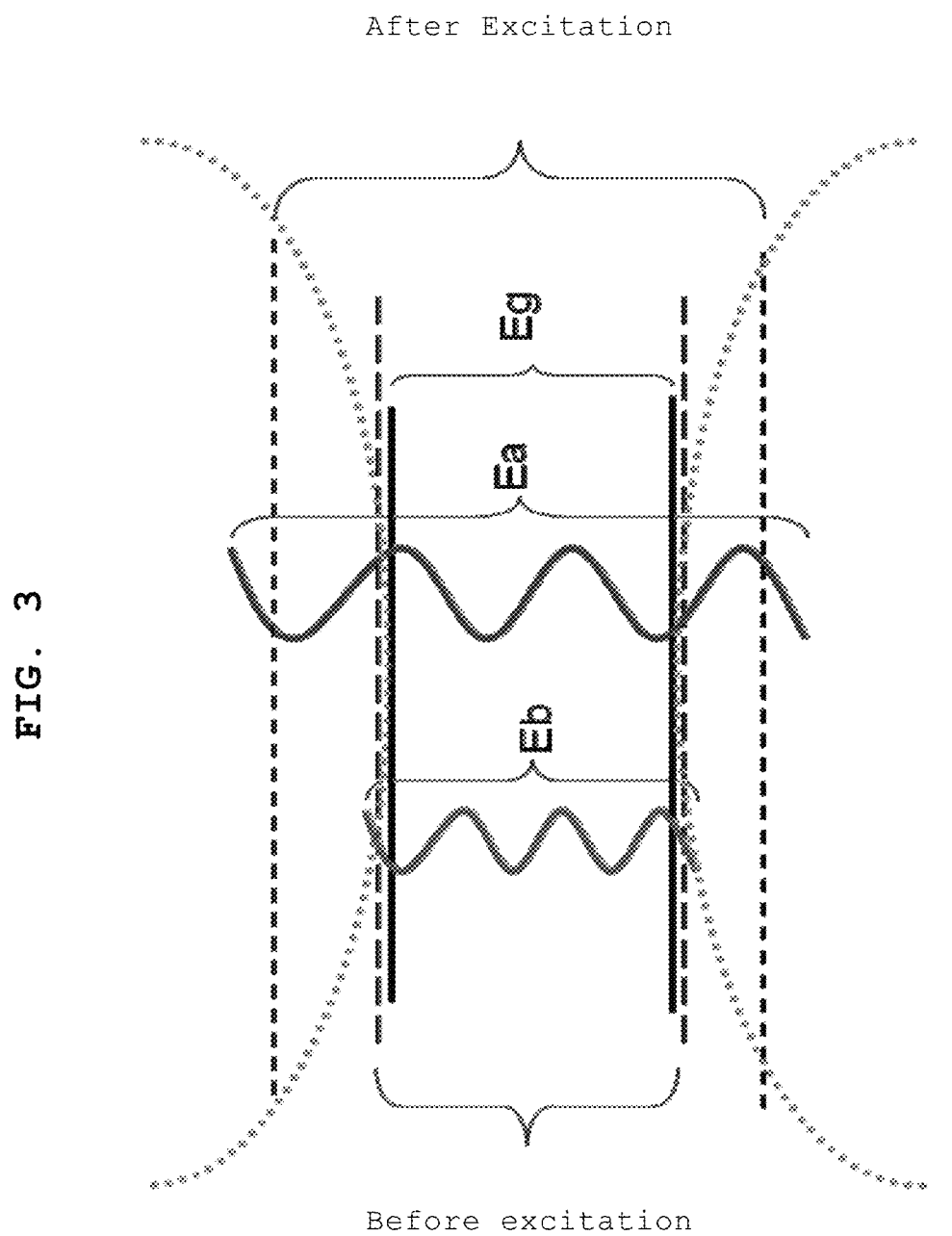

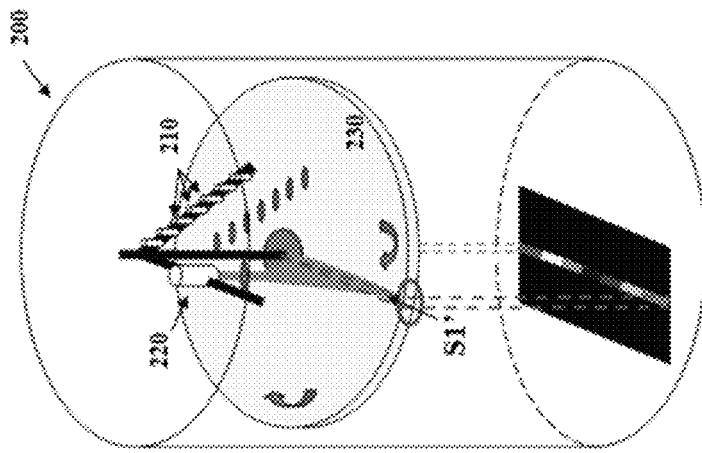
FIG. 4(A)
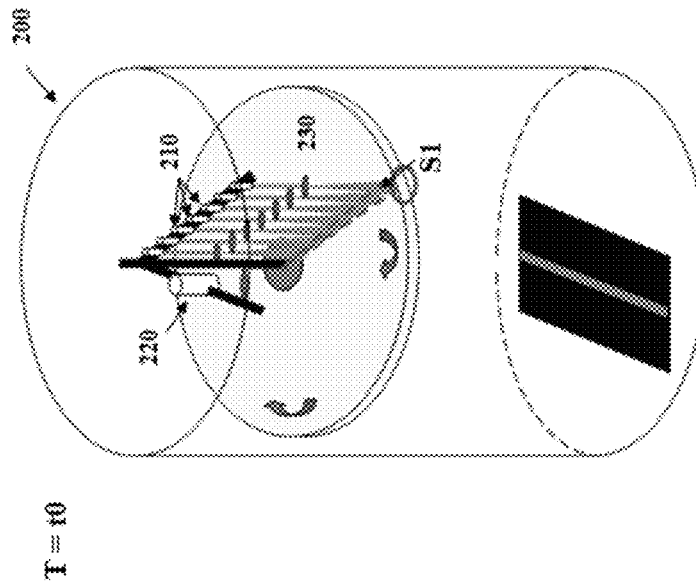
FIG. 4(B)

Power Profile of Pump Laser

An annealing laser Transmittance Profile of Tunable Mask

Power Profile of Transmitted Annealing Laser

LASER ANNEALING DEVICE INCLUDING TUNABLE MASK AND METHOD OF USING THE SAME

CROSS-REFERENCE TO RELATED APPLICATIONS

This application is a divisional application of U.S. patent application Ser. No. 13/935,265 filed on Jul. 3, 2013, which application claims priority to Chinese Patent Application No. 201210533375.5, filed on Dec. 12, 2012 and entitled "Laser Annealing Device and Method", both of which are incorporated herein by reference in their entireties.

FIELD OF THE INVENTION

Embodiments of the present invention relate to the field of integrated circuit (IC) fabrication, and more particularly to a laser annealing.

DESCRIPTION OF THE RELATED ART

Recently, IC feature size has entered a nanometer era along with the development of semiconductor techniques, and thus new challenges have been raised in IC fabrication. In various techniques set forth to address those challenges, the super shallow junction process for the super shallow junction formation and doping of MOS devices, among others, is practically concerned.

Because annealing in the super shallow junction process requires junction depth as shallow as possible and activation temperature as high as possible, laser annealing technique characterized by its high controllability and short process time (e.g. controllable on the magnitude order of $10^{-9}$ s) is introduced.

FIG. 1 shows a process of annealing a wafer 190 with a known laser annealing device 100. The laser annealing device 100 comprises a laser source 120 and a mask 150 having a slit, and optionally a cylinder 160 for accommodating the laser source 120 and the mask 150. During annealing, a laser beam emitted from the laser source 120 passes through the slit which extends in an x-direction shown in FIG. 1, to irradiate the wafer 190, while the laser source 120 itself moves in the direction perpendicular to the direction of the slit, which is y-direction shown in FIG. 1. Therefore, the beam emitted from the laser source 120 irradiates a certain area of the wafer, e.g. region 180 in FIG. 1, during a certain period, in order to anneal the wafer.

The surface of wafer has different capabilities of heat conduction and heat dissipation due to the varied topography and/or materials. FIG. 1 shows a heat profile caused by such differences in topology and/or material, and shows a topology and/or material induced heat map 180. Due to the uneven heat distribution on the wafer surface, annealing with the device 100 shown in FIG. 1 sometimes leads to non-ideal annealing effect, such as unexpected junction depth and/or insufficient activation of the impurities.

One way to even out the heat map and achieve a more even profile is to focus the beam emitted from the laser source to a focal spot of a certain size and perform annealing by scanning a wafer spot-by-spot using the focused beam, that is, irradiate one row in the x-direction spot by spot and then repeat the process for another row. However, this process causes a significant increase in annealing time compared with the existing line-by-line scan.

Another way to overcome the effects of uneven heat distribution is to provide different masks for different heat distribution patterns. However, as a considerable number of annealing processes need to be performed on a wafer during IC fabrication, the heat map would have to be changed after each annealing. Thus, a large number of masks and frequent changes of masks after each annealing step would be needed. These extra steps would lengthen processing time and make room for more errors to occur during the annealing steps.

Thus, a system capable of obliterating or overcoming the effects of a temperature difference effectively and economically is highly desired.

SUMMARY OF THE INVENTION

Thus, a laser annealing device and method is provided in the present disclosure to realize laser annealing with heat map compensation.

In addition to the existing annealing laser source, a pump laser array and a tunable mask are further introduced in the present disclosure, wherein the tunable mask is excited after being irradiated by the pump laser, to exhibit a transmittance profile to the annealing laser that corresponds to the heat map, so as to realize laser annealing with effects of the heat map overcome or negated.

The present disclosure employs a tunable mask instead of a large number of untunable masks provided for each anneal process, thus overcoming the effects of uneven heat distribution in the laser anneal process effectively without a significant increase in complexity. Further, as very high power is required by annealing laser, the present disclosure prevents the direct use of a plurality of annealing lasers by employing a tunable mask and a plurality of pump lasers whose power is much lower, thereby the present disclosure can realize laser annealing with heat map compensation, with slightly increased energy consumption.

According to an embodiment, a laser annealing device is provided, comprising: a pump laser source array including a plurality of pump laser sources, each pump laser source emitting a pump laser beam; an annealing laser source for emitting annealing laser; and a tunable mask for transmitting at least part of the annealing laser after being irradiated by the pump laser.

In one embodiment, the tunable mask has a band gap Eg, the annealing laser has a band gap Eb larger than the Eg, and the pump laser has a band gap Ea larger than the Eb.

In one embodiment, the Ea is equal to or larger than 1.5 times of the Eg; and the Eb is 80~100 meV higher than the Eg.

In one embodiment, the emitting power of each pump laser source in the pump laser source array can be adjusted according to an expected transmittance profile of the tunable mask, and wherein the expected transmittance profile is calculated using a pre-measured heat map of a wafer to be annealed, Eg, and Eb.

In one embodiment, the tunable mask rotates around its rotating axis at a predetermined speed; the plurality of pump laser sources in the pump laser source array are arranged in a first radial direction relative to the rotating axis, the annealing laser source is arranged in a second radial direction relative to the rotating axis, the second radial direction forms a predetermined angle with the pump laser source array; and the pump laser source array and the annealing laser source are fixed to the rotating axis and spaced apart a predetermined distance from the tunable mask along the rotating axis.

In one embodiment, the speed and the angle of the tunable mask are adjustable so that the emitting power of the each pump laser source in the pump laser source array is calculated using the premeasured heat map of the wafer to be annealed, the Eg, the Eb, the speed, the angle, and the Ea.

In one embodiment, the laser annealing device further comprises: a mask with a slit, wherein the annealing laser transmitted through the tunable mask passes through the slit for annealing.

In one embodiment, the tunable mask is made of Si and the annealing laser has a wavelength of about 600 nm.

In one embodiment, the laser annealing device further comprises a plurality of beam expanding lenses, located between the respective various pump laser sources in the pump laser source array and the tunable mask, and between the annealing laser source and the tunable mask.

According to another embodiment, a method of performing laser annealing on a wafer in further provided, comprising: irradiating a tunable mask with pump laser emitted from a pump laser source array composed of a plurality of pump laser sources; irradiating the tunable mask with an annealing laser emitted from an annealing laser source, wherein the tunable mask becomes transmissive to at least part of the annealing laser after being irradiated by the pump laser.

In one embodiment, the tunable mask is rotated around its rotating axis at a predetermined speed; the plurality of pump laser sources of the pump laser source array are arranged in a first radial direction relative to the rotating axis, the annealing laser is arranged in a second radial direction relative to the rotating axis, the second radial direction forms a predetermined angle with the pump laser source array; and the pump laser source array and the annealing laser source are fixed to the rotating axis and spaced apart a predetermined distance from the tunable mask along the rotating axis.

In one embodiment, the tunable mask is made of Si and the annealing laser has a wavelength of about 600 nm.

In one embodiment, the annealing laser transmitted through the tunable mask passes through a slit for annealing.

In one embodiment, the method further comprises before the irradiating the tunable mask with the pump lasers and the annealing laser, expanding the pump laser and the annealing laser to be a spot having a desired size.

Other features and advantages of the present disclosure will become apparent from the following detailed description of exemplary embodiments of the present disclosure given below with reference to accompanying drawings.

BRIEF DESCRIPTION OF THE DRAWINGS

The accompanying drawings, which are incorporated herein and constitute a part of the specification, describe embodiments and, together with the description, serve to explain the principles of the present invention.

FIG. 3 is a diagram showing the relationship between band gaps of each component in the laser annealing device according to an embodiment of the present disclosure;

FIG. 4A and FIG. 4B shows the basic principle of the laser annealing device according to an embodiment of the present disclosure;

DESCRIPTION OF THE EMBODIMENTS

Embodiments of this disclosure are illustrated in accompanying drawings, in which similar reference numbers are used to refer to similar or same parts.

Figure 1:
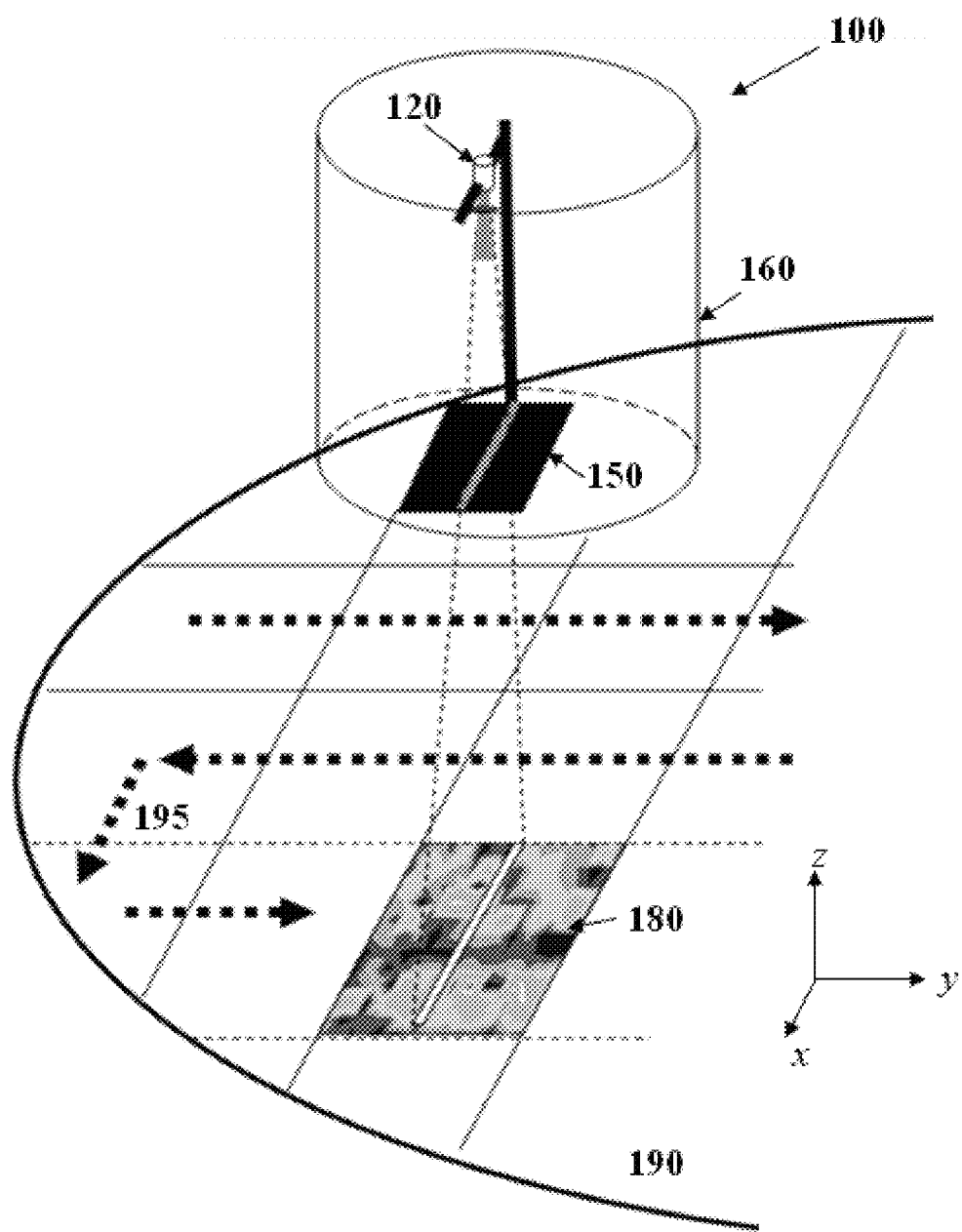
FIG. 1 is a laser annealing device according to the prior art.

In each figure, an x-direction represents a direction in which a slit of the mask extends in an annealing device and a y-direction represents a direction in which the annealing device scans the wafer. The x-direction and the y-direction are perpendicular to each other. In the case when the laser device needs to change direction at the boundary of the wafer (as shown by the arrow 195 in FIG. 1), the annealing device can move along the x-direction. A z-direction is a direction perpendicular to the wafer plane.

Figure 2:
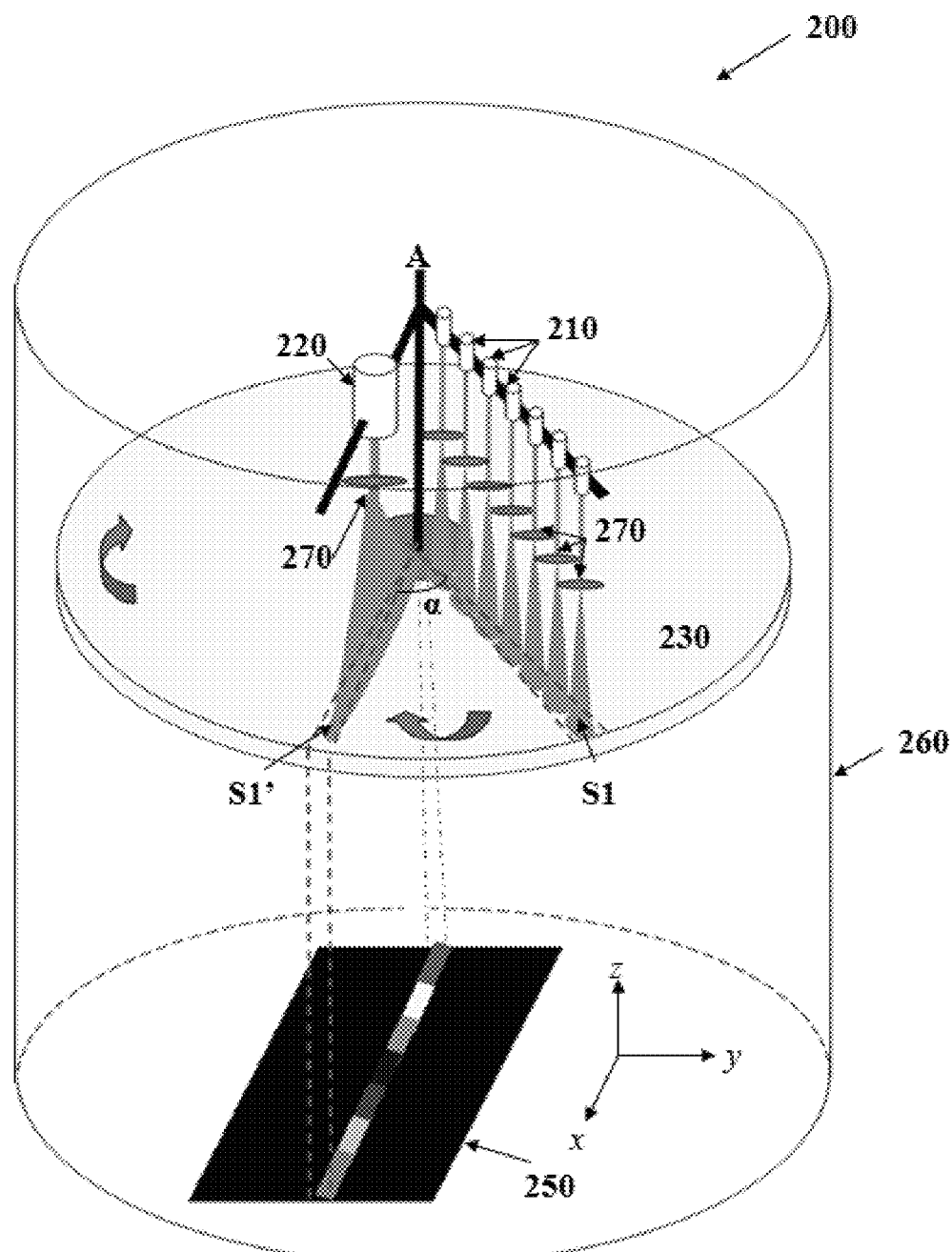
FIG. 2 is a laser annealing device according to an embodiment of the present disclosure.

FIG. 2 shows a laser annealing device 200 according to an embodiment of the present disclosure. The laser annealing device 200 comprises a pump laser source array 210, an annealing laser source 220, and a tunable mask 230. The pump laser source array 210 comprises a plurality of pump laser sources. Each pump laser source has an adjustable power to control a power of an emitted pump laser.

In the particular embodiment shown in FIG. 2, the pump laser source array 210, the annealing laser source 220, and the tunable mask 230 are coaxially arranged, wherein the coaxial axis is axis A in the z-direction as shown in the figure. More particularly, a plurality of pump laser sources of the pump laser source array 210 are arranged in a first radial direction relative to the axis A at an even interval. The annealing laser source 220 is located in a second radial direction relative to the axis A separated from the pump laser source array 210 with an angle (such as, α shown in FIG. 2). The tunable mask 230 is located below the pump laser source array 210 and the annealing laser source 220 at a certain distance (in the z-direction), which receives irradiation from the pump laser source array 210 and the annealing laser source 220 during operation. Although seven pump laser sources arranged radially at an even interval are shown in the figure, this is done for purpose of illustration, and more or less laser sources can be used to achieve a liner or coarser mitigation of the effects of wafer heat profile. Although the plurality of pump laser sources in the pump laser source array 210 are arranged in line parallel to the surface of the tunable mask 230, those skilled in the art may appreciate that, in view of the space occupied by the pump laser sources, those pump laser sources can also be arranged at different heights in the z-direction, so long as ensuring the pump laser present on the tunable mask in a line.

During operation, the pump laser source array 210 and the annealing laser source 220 are fixed with respect to the axis A respectively, while the tunable mask 230 located below the laser sources described above rotates around the axis A at a certain speed. Therefore, an elongated area S1 along a radial direction of the tunable mask 230 is excited after being irradiated by the pump laser. The excited portion is irradiated once again by the annealing laser source 220 (S1' as shown in FIG. 2) after the tunable mask 230 is rotated for a predetermined angle. Through appropriate selection of wavelengths for various pump laser sources of the pump laser source array 210 and the annealing laser source 220, as well as the material of the tunable mask 230, it is possible to make the tunable mask 230 opaque to the annealing laser before being irradiated by the pump laser, and to obtain an annealing laser transmittance profile corresponding to a heat map after irradiation by the pump laser. This way, laser annealing that overcomes the effects of a heat can be realized. In the following description, the principle of exciting the tunable mask 230 with the pump laser to transmit the annealing laser will be described in detail with reference to FIG. 3, and the operation of the coaxially arranged device 200 will be described in detail with reference to FIG. 4.

Now, the principle of modulating laser power with the tunable mask will be described with reference to FIG. 3.

It is known that optical transparency of a certain substance depends on the relationship between its band gap and light band gaps. In an extreme case, if the band gap of substance A is zero, the substance A absorbs lights of all wavelengths (wavelength is in proportion to band gap). If the band gap of a substance B is larger than the band gap of light B' irradiating on the substance B, the light B' can be transmitted through the substance B. On the contrary, if the band gap of a substance C is less than the band gap of light C' irradiating on the subject, the light C' cannot be transmitted through the substance C. Since the band gap of the light C' is larger than the band gap of the substance C, each photon of the light C' irradiated on the subject C will excite electron-hole pairs of the substance C, and thus the band gap of the substance C is increased after being irradiated by the light C'. The extent of increasing in band gap is related to the power of the light C' irradiating thereon. In other words, if the light C' has a constant irradiating time, the band gap of the substance C can be adjusted by the power of the light C'.

FIG. 3 is a diagram showing the relationship between band gaps of various components in the laser annealing device according to an embodiment of the present disclosure, wherein the band gap of the tunable mask is Eg, the band gap of the pump laser is Ea, and the band gap of the annealing laser is Eb. As shown in the FIG. 3, Ea is much larger than Eg, and Eb is slightly larger than Eg. It can be seen from the above principle, since Ea and Eb are both larger than Eg, in common situations, the tunable mask is opaque to both of the pump laser and the annealing laser.

However, in the case of the tunable mask is irradiated by the pump laser first, as Ea is much larger than Eg to make the tunable mask excited, the band gap of the tunable mask is increased due to the excitation. Because Eb is only slightly larger than Eg, the excited tunable mask can transmit at least part of the annealing laser. The annealing laser transmittance through the tunable mask can be controlled by adjusting the emitting powers of the plurality of pump laser sources in the pump laser source array according to the heat distribution map of the wafer, so that a power profile of the annealing laser transmitted through the tunable mask can be obtained to overcome the effects of the wafer heat distribution map.

In addition, the excited tunable mask can restore itself to its unexcited state after a certain period of time, for example, due to environmental thermal balance. Because only a portion of the tunable mask is irradiated each time, the other portion of the tunable mask has enough time to return to its unexcited state. Therefore, during the anneal process of a wafer having various heat maps, it is possible to employ, for example, one tunable mask repeatedly. In one embodiment, Ea much larger than Eg means that Ea is equal to or larger than 1.5 times of Eg. In one embodiment, Eb slightly larger than Eg means that Eb is 80~100 meV larger than Eg. In one embodiment, the tunable mask is made of Si, and thus its band gap is about 1.11 eV. An annealing laser having a wavelength of about 600 nm and a band gap of about 1.2 eV can be selected. Although particular values of Eg, Ea, and Eb are given in the embodiment as described above, those skilled in the art can appreciate that other materials, wavelengths, and correspondence relationships can be used.

Now, the operation of the laser annealing system 200 will be described in detail with reference to FIG. 4(A) and FIG. 4(B), which includes the pump laser source array 210, the annealing laser source 220, and the tunable mask 230 coaxially arranged. As shown in FIG. 4(A), when T=t0, pump laser emitted from the plurality of pump laser sources in the pump laser source array 210 irradiates SI portion of the tunable mask. At that point, no laser, for example, passes through the slit to irradiate the wafer. Because the tunable mask 230 rotates clockwise as shown by the arrows in FIG. 4(A) and FIG. 4(B), when T=t1, the SI portion of the tunable mask rotates to the radial position at which the annealing laser 220 is located (the SI portion is labelled as a SI' in FIG. 4(B)) and is irradiated by the annealing laser source 220. Due to the SI portion having a particular annealing-laser transmittance profile after being irradiated by the pump laser, the annealing laser emitted from the single annealing laser 220 exhibits a particular modulated power profile after being transmitted through the SI' portion. The modulated annealing laser then passes through the slit and irradiates the wafer to even out the effects of the heat distribution on the wafer.

Figure 5A:
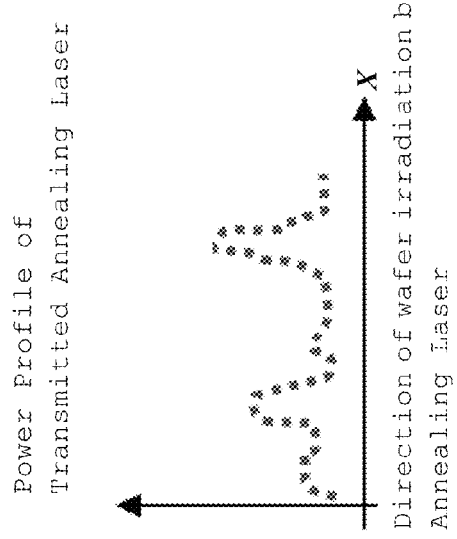
FIG. 5A, FIG. 5B, and FIG. 5C show the correspondence between laser power and transmittance according to an embodiment of the present disclosure.
Figure 5B:
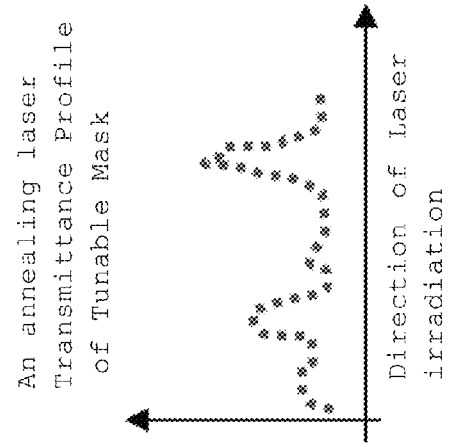
Figure 5C:
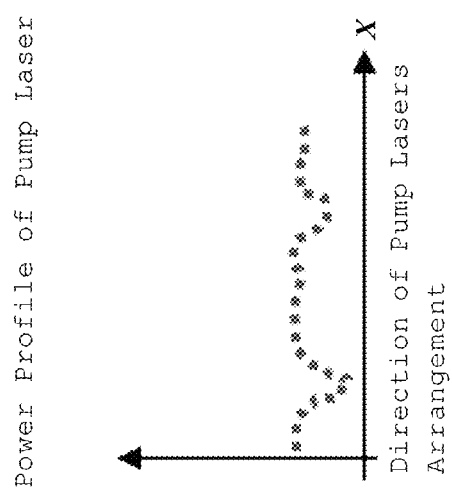

FIGS. 5(A), 5(B) and 5(C) show the correspondence between laser source power and transmittance according to an embodiment of the present disclosure. FIG. 5(A) corresponds to an emitting power profile of various pump laser sources in the pump laser source array, which is adjusted according to the wafer heat map, wherein the x axis represents the direction in which the plurality of pump laser sources are arranged, and each point in the figure corresponds to, for example, the power of a corresponding pump laser source, that is, in FIGS. 4(A) and 4(B), the power of pump laser irradiating S1 at time t0. FIG. 5(B) corresponds to an annealing laser transmittance profile through the tunable mask, wherein the x axis represents the laser irradiation direction, and each point in the figure corresponds to, for example, the annealing laser transmission coefficient of a focal spot area on the tunable mask after being irradiated by pump laser emitted from a corresponding pump laser source, that is, in FIGS. 4(A) and 4(B), transmission coefficient profile of S1 after being irradiated by the pump laser at time t0. FIG. 5(C) corresponds to a power profile of the annealing laser transmitted through the tunable mask, wherein the x axis represents the direction on which the wafer is irradiated by laser, and each point in the figure for example corresponds to the power of the annealing laser irradiated on a corresponding spot area on the wafer. That is, at t1 in FIG. 4(B), the power of the annealing laser emitted from the annealing laser source is transmitted through the S1' portion. The wafer is irradiated by the transmitted annealing laser, so that the wafer is annealed while the heat profile of the wafer is being compensated for.

Figure 6:
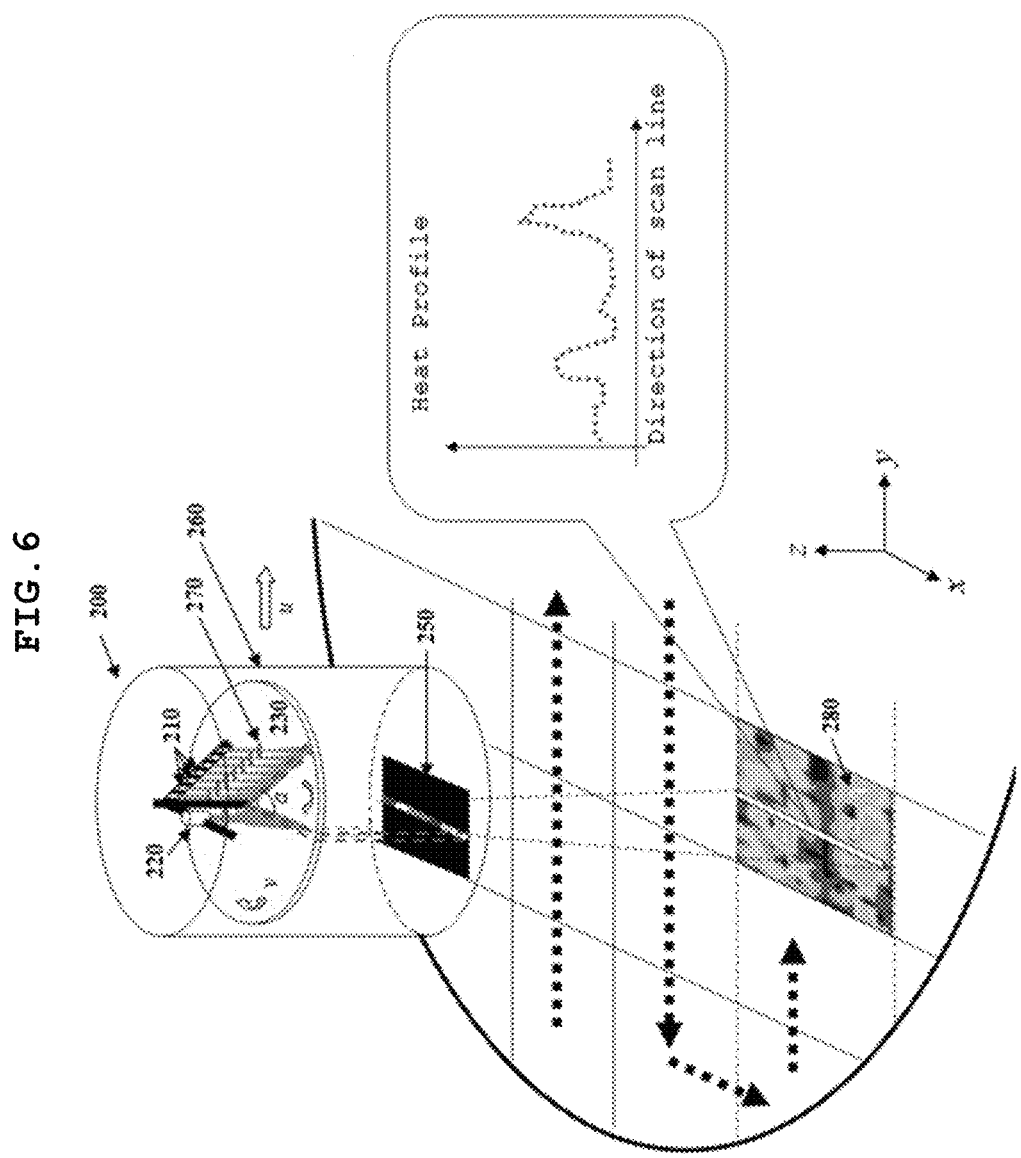
FIG. 6 shows an annealing process that includes a way to overcome the negative effects of uneven heat distribution by using a laser anneal device according to an embodiment of this invention.

FIG. 6 shows an annealing process with heat map compensation performed by a laser annealing device according to an embodiment of the present disclosure. In operation, the heat map of a wafer to be annealed is typically premeasured. After the material of the tunable mask (for example, Si) is selected to determine its band gap Eg (for example, 1.11 eV), the wavelength of annealing laser can be correspondingly selected (for example, 600 nm) to determine its band gap Eb (for example, 1.2 eV). Therefore, according to the premeasured heat distribution map of the wafer to be annealed (e.g., heat map 280 in FIG. 6), the band gap of the tunable mask Eg, and the band gap of annealing laser Eb, an expected transmission coefficient profile is calculated line by line for the tunable mask (for example, the scan line shown in FIG. 6), and then according to the calculated expected transmission coefficient profile, the emitting power of each pump laser source in the pump laser source array 210 is adjusted by line.

In the coaxial arrangement shown in FIG. 6, the tunable mask 230 can be rotated to pass through the pump laser source array 210 and the annealing laser source 220 separated from each other with an angle a at a speed v in sequence. Thus, the speed v and the angle α are also involved in the calculation of the emitting power of each pump laser source in the pump laser source array 210. The tunable mask 230 is continuously rotated at a speed v while the laser annealing device moves along the y-direction at a speed u, so that the successive radial portions of the tunable mask 230 are excited after being irradiated by the pump laser emitted from the pump laser sources in the pump laser source array 210, in which the power of each pump laser source varies according to a corresponding point on the heat map. Thus, effects of the heat map 280 is overcome through annealing laser irradiation. In order to overcome the effects of the heat map 280, the total rotation angle of the tunable mask 230 may be any angle larger than zero, which depends on the length of the heat map in the y-direction, the movement speed of the laser anneal system in the y-direction, the slit width, and the rotation speed of the tunable mask 230 itself, etc. The above annealing process can be repeated for each heat map of a whole wafer.

The coaxially arranged device and the method of the present disclosure have been disclosed in connection with FIGS. 2, 4, and 6. Due to the incorporation of the rotated tunable mask, the whole area of the mask can be used in laser annealing after being excited, such that the time for an irradiated portion to restore to a state suitable for the next pump laser and annealing laser irradiation (the time the tunable mask completes a revolution) is sufficient. Therefore, such a coaxial device can guarantee operation feasibility and continuity of the device and method of the present disclosure. In a coaxial arranged embodiment, the plurality of pump laser sources in the pump laser source array are not necessarily arranged radially (for example, arranged at different heights in the z-direction) so long as pump laser emitted from various pump laser sources can irradiate a radial area of the tunable mask.

In one embodiment, the device 200 further comprises a mask 250 with a slit, annealing laser transmitted through the tunable mask passes through the slit to anneal a wafer. In one embodiment, the device may further comprise a cylinder 260 for accommodating the various components. In one embodiment, the device 200 may further comprise a plurality of beam expanding lenses 270, located between the respective pump laser sources in the pump laser source array and the tunable mask, as well as the annealing laser source and the tunable mask, for expanding laser emitted from various laser sources to be a spot having a desired size.

Although a coaxial arrangement has been disclosed in the above embodiment, the present disclosure is not limited thereto. The present disclosure can be realized, so long as the tunable mask can be irradiated by a pump laser beam emitted from a plurality of pump laser sources, and then the tunable mask is excited and exhibits a particular transmittance profile to annealing laser irradiating the tunable mask later, to anneal according to a wafer heat map by array. In an embodiment, a method for laser annealing on a wafer using any of the above laser annealing devices is further disclosed. The method comprises, first, irradiating a tunable mask with a pump laser beam emitted from a pump laser source array composed of a plurality of pump laser sources, then, irradiating the tunable mask with an annealing laser beam emitted from an annealing laser source. The tunable mask becomes transmissive to at least part of the annealing laser after being irradiated by the pump laser.

The detailed description above comprises a laser annealing device including a pump laser source array, an annealing laser source, and a tunable mask; and a anneal method, in which the tunable mask is first irradiated by pump laser to make the mask excited, and then a wafer is annealed with heat map compensation by the irradiation of annealing laser transmitted through the excited mask.

Those skilled in the art may understand that various modifications can be made to the above embodiments without departing from the scope of the present disclosure, which is defined by the following claims.

What is claimed is:

1. A method of performing laser annealing on a wafer, comprising:
    irradiating a tunable mask with pump lasers emitted from pump laser sources, the pump laser sources forming a pump laser source array;
    irradiating the tunable mask with an annealing laser emitted from an annealing laser source,
    wherein the tunable mask becomes transmissive to at least part of the annealing laser after being irradiated by the pump lasers,
    wherein the tunable mask has a band gap Eg, the annealing laser has an optical band gap Eb larger than the band gap Eg, and the pump lasers has an optical band gap Ea larger than the optical band gap Eb, and
    wherein the tunable mask is substantially opaque to the annealing laser when it is not irradiated by the pump lasers.

2. The method according to claim 1, wherein
the Ea is equal to or larger than 1.5 times of the Eg; and
the Eb is 80~100 meV larger than the Eg.

3. The method according to claim 1,
    wherein the emitting power of each of the pump laser sources in the pump laser source array is adjusted according to an expected transmittance profile of the tunable mask, and
    wherein the expected transmittance profile is calculated using a pre-measured heat map of a wafer to be annealed, the Eg, and the Eb.

4. The method according to claim 1, wherein:
    the tunable mask is rotated around its rotating axis at a predetermined speed;
    the pump laser sources in the pump laser source array are arranged in a first radial direction relative to the rotating axis;
    the annealing laser source is arranged in a second radial direction relative to the rotating axis, the second radial direction forms a predetermined angle with the pump laser source array; and
    the pump laser source array and the annealing laser source are fixed to the rotating axis, the pump laser source array and the annealing laser source being spaced apart a predetermined distance from the tunable mask along the rotating axis.

5. The method according to claim 4, wherein the predetermined speed and the predetermined angle are adjustable so that the emitting power of each of the pump laser sources in the pump laser source array is calculated using
    a pre-measured heat map of a wafer to be annealed,
    the Eg, the Eb,
    the predetermined speed, the predetermined angle, and the Ea.

6. The method according to claim 1, wherein the tunable mask is made of Si, and the annealing laser has a wavelength of 600 nm.

7. The method according to claim 1, wherein the annealing laser transmitted through the tunable mask passes through a slit for annealing.

8. The method according to claim 1, further comprising before the irradiating the tunable mask with the pump lasers and the annealing laser, expanding the pump lasers and the annealing laser to be a spot having a desired size.

* * * * *